(12) United States Patent
Widhalm

(10) Patent No.: US 9,007,064 B2
(45) Date of Patent: Apr. 14, 2015

(54) NON-DESTRUCTIVE EVALUATION METHODS FOR ELECTRIC JOINTS

(75) Inventor: Humi Widhalm, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 587 days.

(21) Appl. No.: 13/353,866

(22) Filed: Jan. 19, 2012
(Under 37 CFR 1.47)

(65) Prior Publication Data
US 2013/0187671 A1   Jul. 25, 2013

(51) Int. Cl.
| G01N 27/416 | (2006.01) |
| G01R 27/08 | (2006.01) |
| G01R 31/08 | (2006.01) |
| G01R 31/36 | (2006.01) |
| B23K 31/12 | (2006.01) |
| G01R 27/14 | (2006.01) |
| G01R 31/04 | (2006.01) |

(52) U.S. Cl.
CPC ............. *G01R 31/36* (2013.01); *B23K 31/125* (2013.01); *G01R 27/14* (2013.01); *G01R 31/04* (2013.01)

(58) Field of Classification Search
CPC ........ G01R 31/36; G01R 31/04; G01R 27/14; G01R 27/02; B23K 11/115; B23K 11/125
USPC .......................................... 324/426, 525, 691
See application file for complete search history.

(56) References Cited

U.S. PATENT DOCUMENTS

| 3,916,304 A * | 10/1975 | Roemer et al. ................ 324/718 |
| 6,168,470 B1 | 1/2001 | Ikeda et al. |
| 6,520,018 B1 | 2/2003 | Flores-Lira |
| 7,545,147 B2 | 6/2009 | Hart et al. |
| 7,977,949 B2 * | 7/2011 | Williams ....................... 324/525 |
| 8,450,644 B2 | 5/2013 | Tang et al. |
| 2011/0108181 A1 | 5/2011 | Cai et al. |
| 2011/0186204 A1 | 8/2011 | Cai et al. |
| 2013/0187658 A1 * | 7/2013 | Widhalm ....................... 324/430 |

FOREIGN PATENT DOCUMENTS

JP   2007059329 A   3/2007

OTHER PUBLICATIONS

Non-final Office Action mailed Jan. 2, 2015, U.S. Appl. No. 13/353,838, filed Jan. 19, 2012.

* cited by examiner

*Primary Examiner* — Amy He
(74) *Attorney, Agent, or Firm* — David B. Kelley; Brooks Kushman P.C.

(57) ABSTRACT

In one embodiment, a method of evaluating electric joints includes: partially separating a terminal portion from a busbar portion of a joint formed between a battery cell terminal and an interconnector busbar; and measuring electric resistance between the terminal portion and the busbar portion. In another embodiment, the step of measuring includes connecting the terminal portion of the joint to a first clip of a first polarity and connecting the busbar portion of the joint to a second clip of an opposing polarity.

20 Claims, 5 Drawing Sheets

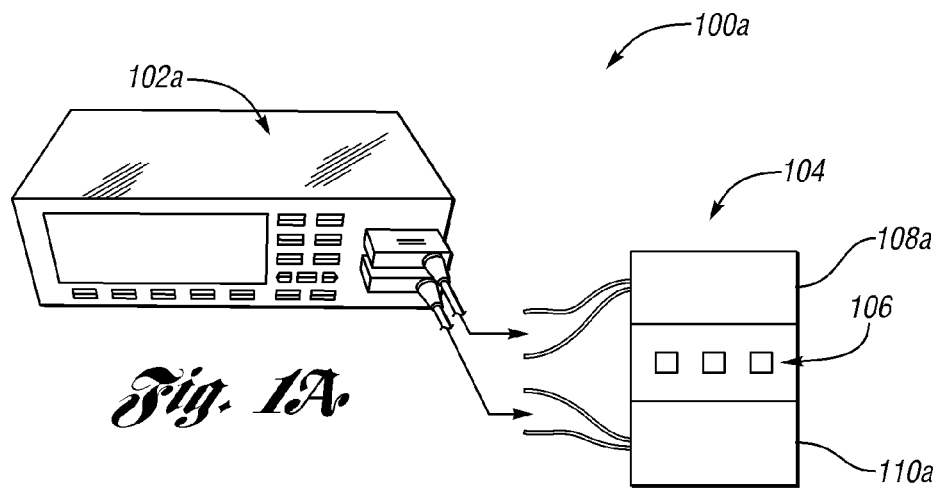
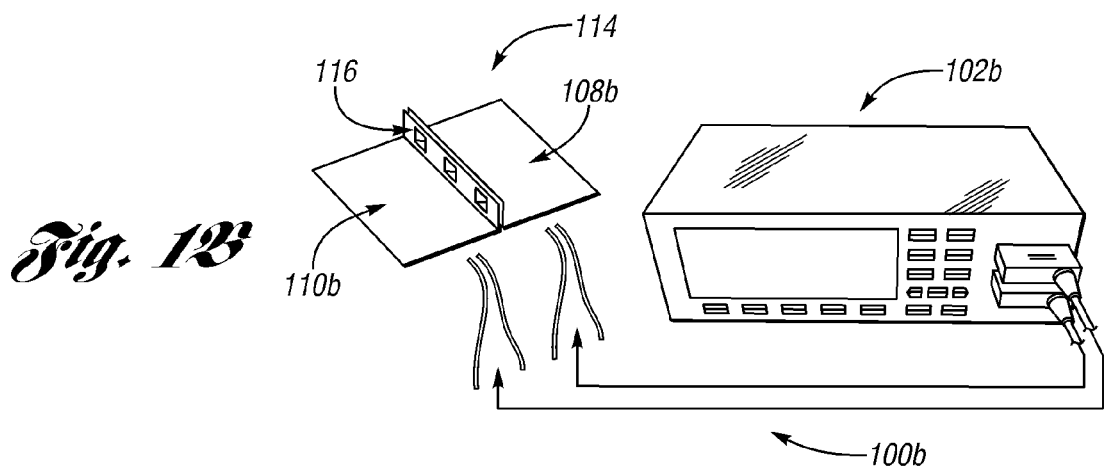
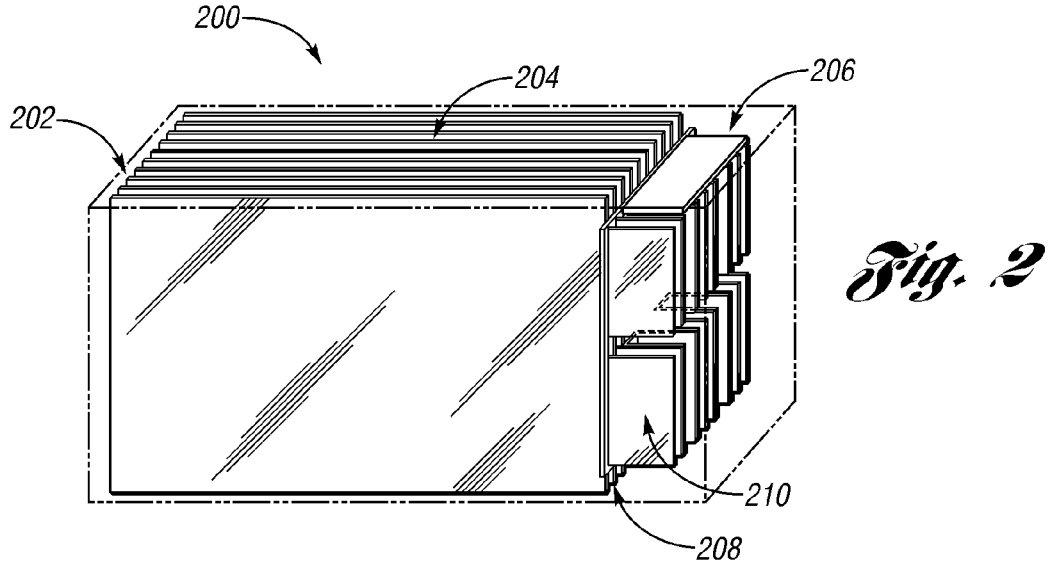

NON-DESTRUCTIVE EVALUATION METHODS FOR ELECTRIC JOINTS

TECHNICAL FIELD

The present invention relates to Non-Destructive Evaluation (NDE) methods for verification and validation of electric joints.

BACKGROUND

To assemble battery modules in high-voltage (HV) battery packs for electric vehicles (EV), battery cell terminals are joined to interconnector busbars. To verify and validate the electric joints, destructive testing methods such as mechanical testing of joined coupons or actual battery modules have been invented by the present inventor and used successfully. However, NDE methods are desirable, particularly for in-line inspection of the electric joints during mass production.

SUMMARY

In one embodiment, a method of non-destructively evaluating an electric joint formed between a battery cell terminal and an interconnector busbar, the method including at least partially separating a terminal portion of battery cell terminal and a busbar portion of the interconnector busbar such that the terminal portion and the busbar portion are spaced apart from each other; and measuring electric resistance across the joint.

In another embodiment, the step of measuring includes connecting the terminal portion of the joint to a first clip of a first polarity and connecting the busbar portion of the joint to a second clip of an opposing polarity of the electric resistance measurement instrument.

In yet another embodiment, the method further includes flipping the first and second clips such that the terminal portion is connected to the second flip and the busbar portion is connected to the first flip, and repeating the measuring of electric resistance.

In yet another embodiment, the method further includes obtaining an average value of the electric resistance before and after the flipping. In certain instances, the method further includes comparing the average value to a pre-determined criterion.

In yet another embodiment, the method further includes insulating adjacent joints of battery cell terminals and interconnector busbars.

In yet another embodiment, the method further includes providing a correlation table tabulating mean electric resistance as a function of mean peak load. In certain instances, the providing step includes providing a correlation table tabulating mean electric resistance (MER) as a function of mean peak load (MPL) with the function represented as: $MER = a - bMPL + cMPL^2$, wherein a, b and c are each a constant.

BRIEF DESCRIPTION OF THE DRAWINGS

FIG. 1A schematically depicts an exemplary system for evaluating electric joints, including a lap shear coupon sample and a measurement device;

FIG. 1B schematically depicts an exemplary system for evaluating electric joints, including a coach peel coupon sample and a measurement device;

FIG. 2 schematically depicts a battery module in a perspective view;

DETAILED DESCRIPTION

Figure 3A:
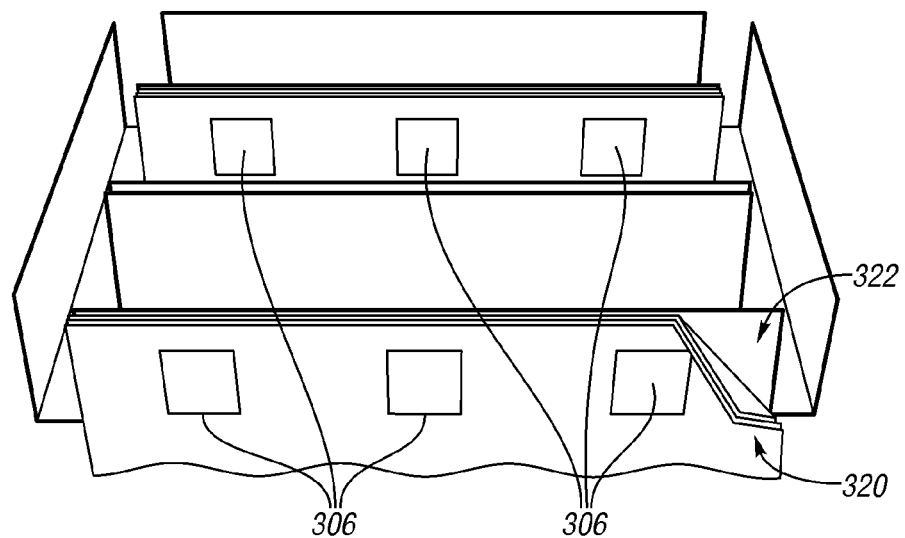
FIG. 3A schematically depicts a partial perspective of a battery module of FIG. 2.

As required, detailed embodiments of the present invention are disclosed herein. However, it is to be understood that the disclosed embodiments are merely exemplary of the invention that may be embodied in various and alternative forms. Therefore, specific structural and functional details disclosed herein are not to be interpreted as limiting, but merely as a representative basis for the claims and/or a representative basis for teaching one skilled in the art to variously employ the present invention.

Moreover, except where otherwise expressly indicated, all numerical quantities in the description and in the claims are to be understood as modified by the word "about" in describing the broader scope of this invention. Also, unless expressly stated to the contrary, the description of a group or class of material is suitable or preferred for a given purpose in connection with the invention implies that mixtures of any two or more members of the group or class may be equally suitable or preferred.

The present invention, in one or more embodiments, is advantageous by providing a non-destructive method for evaluating battery joins formed between battery cell terminals and ICB busbars in battery modules. Target electric requirements are set for the joints between battery cell terminals and ICB busbars in battery modules of HV battery packs for EV applications. Pass/Fail criteria, based on component limitations, are correlated to electrical resistance across joints. Generally speaking, lower interfacial resistance across the joints generates lower power loss and less heat buildup around the joints as well. The non-destructive evaluation method disclosed herein meets/exceeds the requirements for the in-line inspection of electric joints on battery modules.

In one or more embodiments, the term "non-destructively" refers to a method of evaluating electric joints of battery modules used on-board a vehicle without having to completely dissemble the joined parts, such that the evaluation may be carried out for an in-line inspection. In certain instances, the term "NDE" refers to a method of evaluating a joint without destroying the joint, such that the evaluation is particularly suitable for an in-line inspection.

In one or more embodiments, the term "joint(s)" or "electric joint(s)" refers to joined battery components in a battery cell module. In certain instances, the joined battery components include joints formed between one ICB busbar and one or more battery cell terminals. In certain instances, the term "joint(s)" or "electric joint(s)" refers to a connection between two or more components of any materials or conductive materials. One joint may include one, two, three or more welds or nuggets. Battery modules include joints between one or more battery cell terminals and one interconnector busbar.

Non-limiting joining methods include thermal joining, electric joining, ultrasonic welding, laser welding, brazing, fastening/riveting/clinching/crimping, and soldering.

The present invention, in one or more embodiments, is advantageous also in providing a method of evaluating weld status with relatively high precision. The method can decipher between the following joint conditions: (i) no weld, (ii) open weld, and (iii) inadequate weld.

The present invention, in one or more embodiments, is advantageous also by providing correlation methods between electrical resistance and beginning of life (or "BOL") weld strength. Statistically sound correlation to BOL weld strength can be provided.

The present invention, in one or more embodiments, is advantageous also in providing NDE methods of very high detectability, resolution and sensitivity for detecting joint defects, such as (i) no weld, (ii) open weld, and (iii) inadequate weld.

The present invention, in one or more embodiments, is advantageous also in providing methods and statistically sound correlations between electric resistances and strengths of electric joints, as well as electric Pass/Fail criteria for electric joints, in particular, the electric joints in battery modules of HV battery packs for EV applications.

As schematically depicted in FIGS. 1A and 1B, exemplary systems 100a and 100b are provided to carry out one or more methods for non-destructively evaluating electric joints, particularly the electric joints in battery modules.

System 100a includes an electric resistance measurement instrument 102a and a lap-shear coupon sample 104. The lap-shear coupon sample 104 includes a first group of material(s) 108a and a second group of material(s) 110a, with the two groups of materials joined by one or more welds at the location where they overlap to form a lap-shear joint 106. The electric resistance measurement instrument 102a measures electric resistance across the lap-shear joint 106. In certain instances, the first group 108a may include one or more sheets or foils, and can be a coupon model for one or more battery cell terminals. In certain other instances, the second group 110a may include one sheet or foil, and can be a coupon model for one interconnector busbar.

System 100b includes an electric resistance measurement instrument 102b and a coach-peel coupon sample 114. The coach-peel coupon sample 114 includes a first group of material(s) 108b and a second group of material(s) 110b, with the two groups of materials joined by one or more welds at the location where their bent edges mate to form a coach-peel joint 116. The electric resistance measurement instrument 102b measures electric resistance across the coach-peel joint 116. In certain instances, the first group of material(s) 108b may include one or more sheets or foils, and can be a coupon model for one or more battery cell terminals. In certain other instances, the second group of material(s) 110b may include one sheet or foil, and can be a coupon model for one interconnector busbar.

FIG. 2 schematically depicts a non-limiting example of a battery module 200 in a perspective view. The packaging geometry for the battery module 200 is shown at 202. The battery module 200 includes a series of battery cells 204. Each battery cell 204 includes two battery cell terminals 206. The battery cell terminals 206 are arranged in a predetermined pattern to align with an interconnector board (ICB) 208. The ICB 208 includes several interconnector busbars 210 to which the battery cell terminals 206 are joined via any suitable methods including ultrasonic welding. Each joint has one or more welds joining one or more battery cell terminals and one interconnector busbar at the location where they overlap and mate.

Figure 3B:
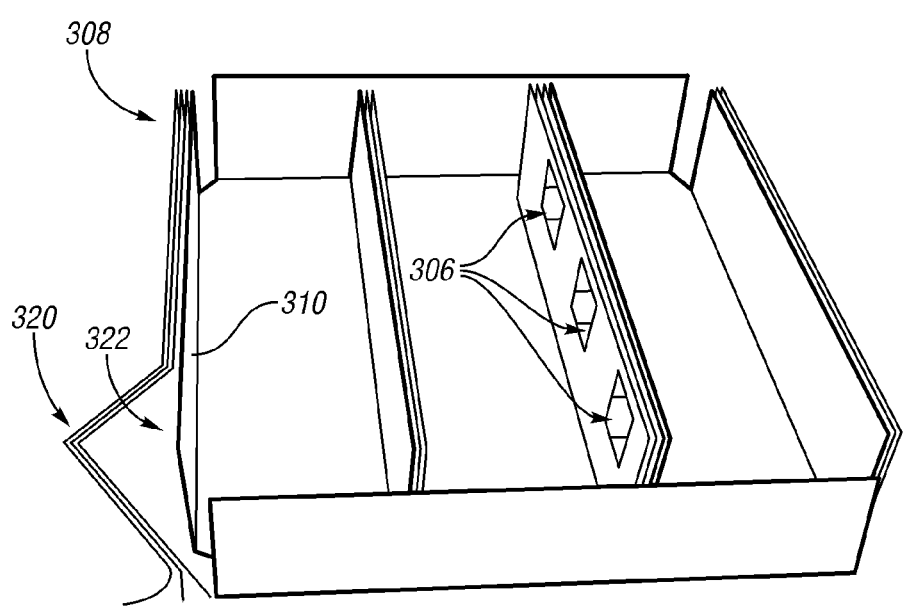
FIG. 3B schematically depicts another partial perspective view of the battery module of FIG. 3A.

FIGS. 3A and 3B schematically depict partial views of a battery module 200 of FIG. 2, where electric joints with three welds 306 per joint are shown between multiple battery cell terminals 308 and an interconnector busbar 310. As illustrated in FIGS. 3A & 3B, small corners or edges 320 of the battery cell terminals 308 are gently peeled and bent away from the corner or edge 322 of the mating/overlapping interconnector busbar 310 without damaging the joint between them.

Figure 4:
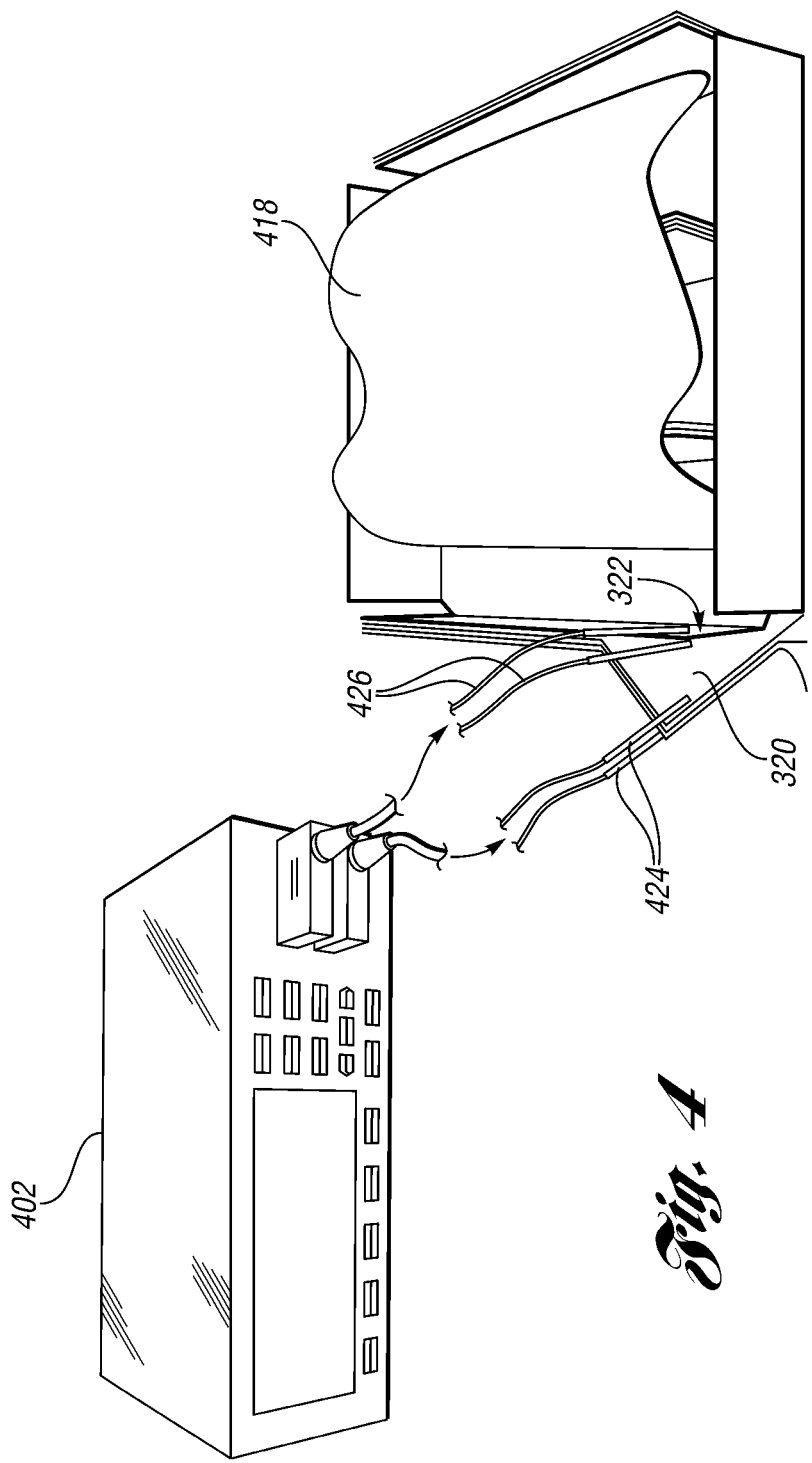
FIG. 4 schematically depicts an exemplary system for non-destructively evaluating electric joints in a battery module.

As schematically depicted in FIG. 4, an insulation 418 of any suitable insulating material of any form is provided over surrounding battery cell terminals and interconnector busbars prior to any measurement. Then, the bent corners or edges 320 of the battery cell terminals are clamped by a clip 424 of a first polarity, and the exposed corner or edge 322 of the mating/overlapping interconnector busbar is clamped by another clip 426 of an opposing polarity. While the clips 424 and 426 are connected via wires to an electric resistance measurement instrument 402, the electric resistances across the joint between the battery cell terminals and interconnector busbar are recorded. One of the two clips is then flipped to exchange "source" and "sense", and the measuring of electric resistances is repeated. An average value of the electric resistances before and after the flipping, respectively, is obtained and compared with the electric Pass/Fail criteria for verification and validation of the electric joint. Finally, the bent corners or edges 320 of the battery cell terminals are gently returned back to the original position, flat and in intimate contact to the mating/overlapping interconnector busbar, without damaging the joint between them. In certain instances, an electric joint in real battery modules may include one or more battery cell terminals and one interconnector busbar.

A non-limiting example of the NDE method for electric joints in real battery modules includes the following steps: turning on an electric resistance measurement instrument, for example, Hioki 3560 AC mΩ HiTester or newer versions, at least 5 minutes before measurements; holding joint area tightly using one hand to prevent peel damage to the joint; peeling and bending battery cell terminals from one corner or edge gently using the other hand; placing an insulation of any form (clean paper or any suitable insulating materials) on all adjacent battery cell terminals and interconnector busbars around the joint to be measured; clamping the exposed corner or edge of the interconnector busbar with one clip of positive polarity; clamping the bent corners or edges of the battery cell terminals with the other clip of negative polarity; ensuring the two clips not in contact to each other, and the clips not in contact to any other battery cell terminals and busbars; measuring electric resistance across the joint using the electric resistance measurement instrument and averaging the first 10 readings; or if the number does not change, accepting the reading; flipping one of the two clips, repeating the measurements, and recording both averaged data points. The two averaged readings should be same or not statistically significantly different if the same spot is clamped; holding the joint area tightly using one hand while the other hand gently returning the bent corners or edges of the battery cell terminals back to the original position, flat and in intimate contact to the mating/overlapping interconnector busbar, without damaging the joint between them; and verifying and validating the electric joint by comparing the measured electric resistances with the electric Pass/Fail criteria.

For correlating the electric resistances and strengths of electric joints, and deriving the electric Pass/Fail criteria, coupon samples may be prepared from flat or bent, sheets or foils of conductive materials in the configurations including 1-layer sheet/foil with 1-layer sheet, 2-layers of sheets/foils with 1-layer sheet, 3-layers of sheets/foils with 1-layer sheet, or multiple layers of foils with 1-layer sheet/foil, for lap-shear joints or coach-peel joints.

A non-limiting method for correlating the electric resistances and strengths of electric joints includes the following steps: creating electric joints from each pair of the coupon materials with different joint strengths and thus different electric resistances across the joints; measuring individual electric resistances across the joints on the multiple samples, averaging the individual electric resistances of the multiple samples at each level combination of the process parameters, and recording the average (mean) electric resistances at all levels' combinations of the process parameters; measuring individual joint strengths such as peak loads of the same joints, averaging the individual peak loads of the multiple samples at each level combination of the process parameters, and recording the average (mean) peak loads at all levels' combinations of the process parameters; and correlating the mean electric resistances and the mean peak loads, and establishing a mathematical equation using statistic analyses such as regression.

In certain instances, the regression equation includes a polynomial:

$$MER = a + bMPL + cMPL^2$$

where MER is the mean electric resistances in mOhm (m$\Omega$), MPL is the mean peak loads in Newton (N), and a, b and c are polynomial coefficients. The values of a, b and c depend on many factors such as the materials of electric joints, the number, geometry and size of welds per joint, the joining method, the electric resistance measurement instrument and its calibration, the surface conditions of measurement clips and clamped areas, and the gauge repeatability & reproducibility (GR&R). Accordingly, the values of a, b and c vary with these conditions.

In one or more embodiments, the term "peak load" refers to the maximum load at which joint fracture starts during mechanical testing of a lap-shear joint or coach-peel joint and hence a measure of joint strength.

A non-limiting method for deriving the electric Pass/Fail criteria includes the following steps: measuring individual electric resistance across for example a joint of three welds with all three welds being good, i.e., about 100% good joint, repeating the same measurement on multiple (at least three preferably) joints having three welds per joint and with all three welds being good on each joint, averaging the individual electric resistances of the multiple joints, and recording the mean electric resistance; measuring individual electric resistances across for example joints having three welds per joint with (1) one good weld, one fractured weld with most mating surfaces in contact, and one cracked but fully connected weld, i.e., about 80% good joint, (2) one good weld, one fractured weld with few mating surfaces in contact, and one cracked but partially connected weld, i.e., about 65% good joint, and (3) two open welds and one partially connected weld, i.e., about 15% good joint, respectively, repeating the same measurements on multiple (at least three preferably) samples having three welds per sample and with one of the above three joint conditions per group of multiple samples, respectively, and averaging the individual electric resistances per joint condition, respectively, and recording the mean electric resistances for all joint conditions; setting the electric "Pass" criterion using the mean electric resistance corresponding to for example ≥80% good joints; setting the electric "Fail" criterion using the mean electric resistance corresponding to for example <65% good joints; setting the electric "Marginal" criterion using the mean electric resistances corresponding to for example ≥65% but <80% good joints; setting, alternatively, the electric Pass/Fail criteria using engineering design spec(s) or requirement(s) on electric joints.

Figure 5:
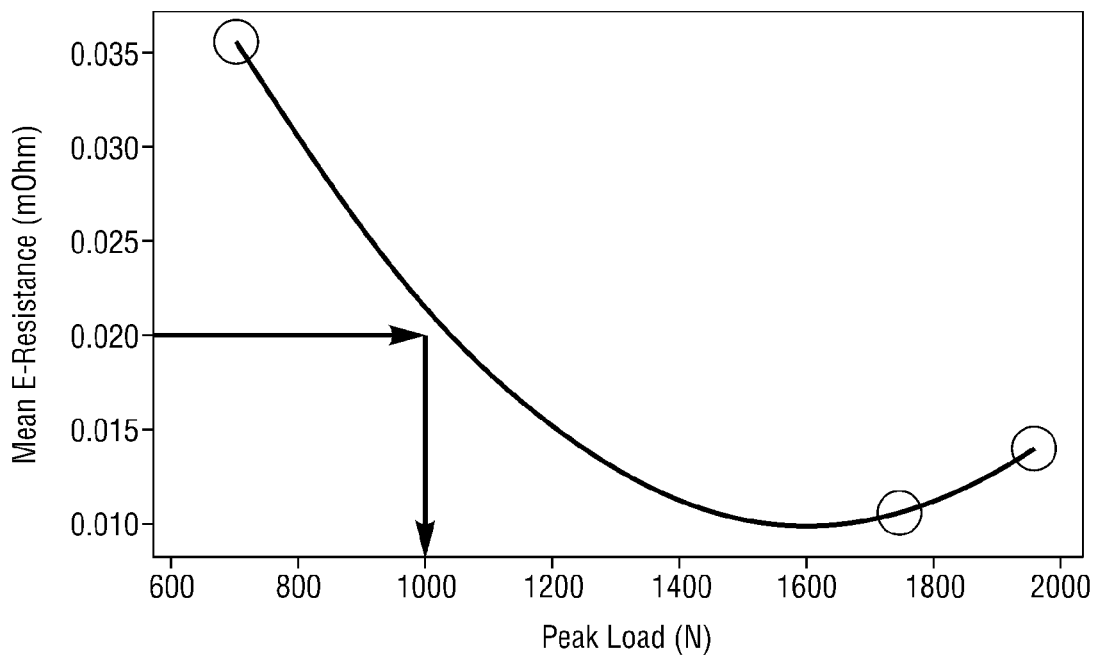
FIG. 5 illustratively depicts values of electric resistance as a function of values of peak load.

FIG. 5 depicts exemplary electric Pass/Fail criteria for the electric joints with three ultrasonic welds (USW) per joint between either of the materials of battery cell terminals in sheets/foils and the material of interconnector busbars in sheet with various configurations and on either coupons or real battery modules as measured using Hioki 3560 AC m$\Omega$ Hi-Tester. The electric Pass/Fail criteria for electric joints depend upon the materials of electric joints, the number, geometry and size of welds per joint, the joining method, the electric resistance measurement instrument and its calibration, the surface conditions of measurement clips and clamped areas, and the GR&R. Accordingly, the electric Pass/Fail criteria may be adjusted based on these conditions.

As a non-limiting example, the electric resistance thresholds in the electric Pass/Fail criteria need to be increased correspondingly if a material(s) of higher electric resistivity is/are selected for electric joints, and/or the number and/or size of welds per electric joint are/is reduced by design, and/or a joining method such as fastening is used, and/or an electric resistance measurement instrument calibrated to higher readings is used, and/or the surfaces of measurement clips and/or clamped areas are rougher or routinely contaminated, and/or the electric resistance measurement instrument and/or operator are/is constantly over-biased.

Although the peak loads are different between coupon samples and real battery modules due to the different fracture mechanisms under different load conditions corresponding to their different layouts, the electric resistances across the electric joints on coupon samples and real battery modules are identical for the same materials of the electric joints, the same number and size of welds per electric joint, the same joining method, the same electric resistance measurement instrument, and the same surface conditions of measurement clips and clamped areas. Therefore, the electric Pass/Fail criteria invented herein are applicable to the electric joints on both coupon samples and real battery modules.

If electric joints are evaluated before any aging, the electric resistances and peak loads measured are considered as BOL conditions. If electric joints are evaluated after they reach the end of service life or a pre-determined number of cycles in a simulating fatigue test, the electric resistances and peak loads measured afterwards are regarded as EOL conditions. Since the functionality requirements on electric joints at EOL are the same as at BOL, the electric properties such as electric resistances at EOL are required to be the same as at BOL. Thus, the electric Pass/Fail criteria invented herein are valid throughout the entire service life of the electric joints including both BOL and EOL. Hence, the threshold for satisfactory EOL electric resistance can be deducted from the electric Pass/Fail criteria invented herein. This threshold for satisfactory EOL electric resistance can be correlated to the satisfactory EOL joint strengths using the regression method invented herein. By conducting fatigue tests, the satisfactory EOL joint strengths can in-turn be correlated to the satisfactory BOL joint strengths, and thus set the minimum BOL joint strengths.

In one or more embodiments, the term "peak load" refers to the maximum load at which joint fracture starts in the lap shear test or coach peel test and hence a measure of BOL joint strength.

Figure 6:
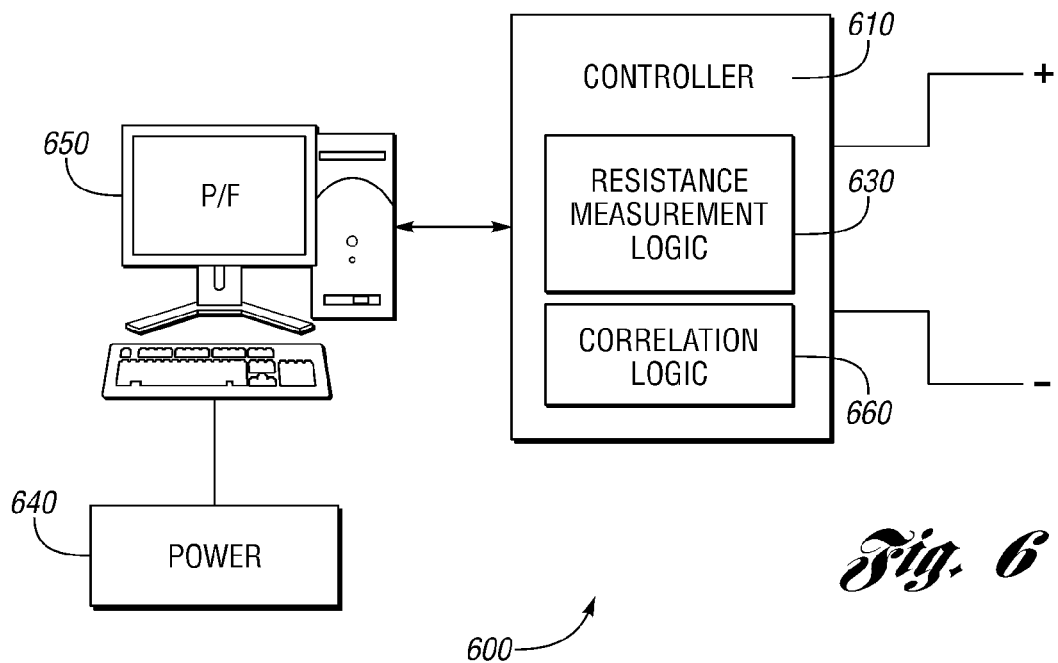
FIG. 6 schematically depicts an exemplary system for processing electric resistance information.

FIG. 6 illustrates a schematic example of a system 600 for processing electric resistance information and determining a Pass/Fail (P/F). A computing device 650 is powered by a power source 640 and processes electric resistance information. The computing device 650 includes a controller 610 for controlling software and algorithms as described herein to measure and analyze the electric resistance information. For example, the controller 610 includes resistance measurement logic 650 to receive and compute information provided by the electric resistance measurement instrument 102a, 402. The controller 610 also includes correlation logic 660 to correlate the joint strength, for example, as shown and described with reference to FIG. 8 below.

A non-limiting example of the pass-fail criteria method includes measuring individual electric resistance across for example three joints with all three joints being good, i.e., about 100% good joints, repeating the same measurement on multiple (at least three preferably) samples having three joints per sample and with all three joints being good on each sample, averaging the individual electric resistances of the multiple samples, and recording the mean electric resistance; measuring individual electric resistances across for example three joints with one good joint, one fractured joint with most mating surfaces in contact, and one cracked but fully connected joint, i.e., about 80% good joints, one good joint, one fractured joint with few mating surfaces in contact, and one cracked but partially connected joint, i.e., about 65% good joints, and two open joints and one partially connected joint, i.e., about 15% good joints, respectively, repeating the same measurement on multiple (at least three preferably) samples having three joints per sample and with one of the above joint conditions per group of multiple samples, respectively, and averaging the individual electric resistances per joint condition, respectively, and recording the mean electric resistances for all joint conditions; setting the electric pass criterion using the mean electric resistance corresponding to for example ≥80% good joints; setting the electric fail criterion using the mean electric resistance corresponding to for example <65% good joints; setting the electric marginal criterion using the mean electric resistance corresponding to for example ≥65% but <80% good joints; setting, alternatively, the electric Pass/Fail criteria using engineering design spec or requirement(s) on electric joints.

Figures 7, 8:
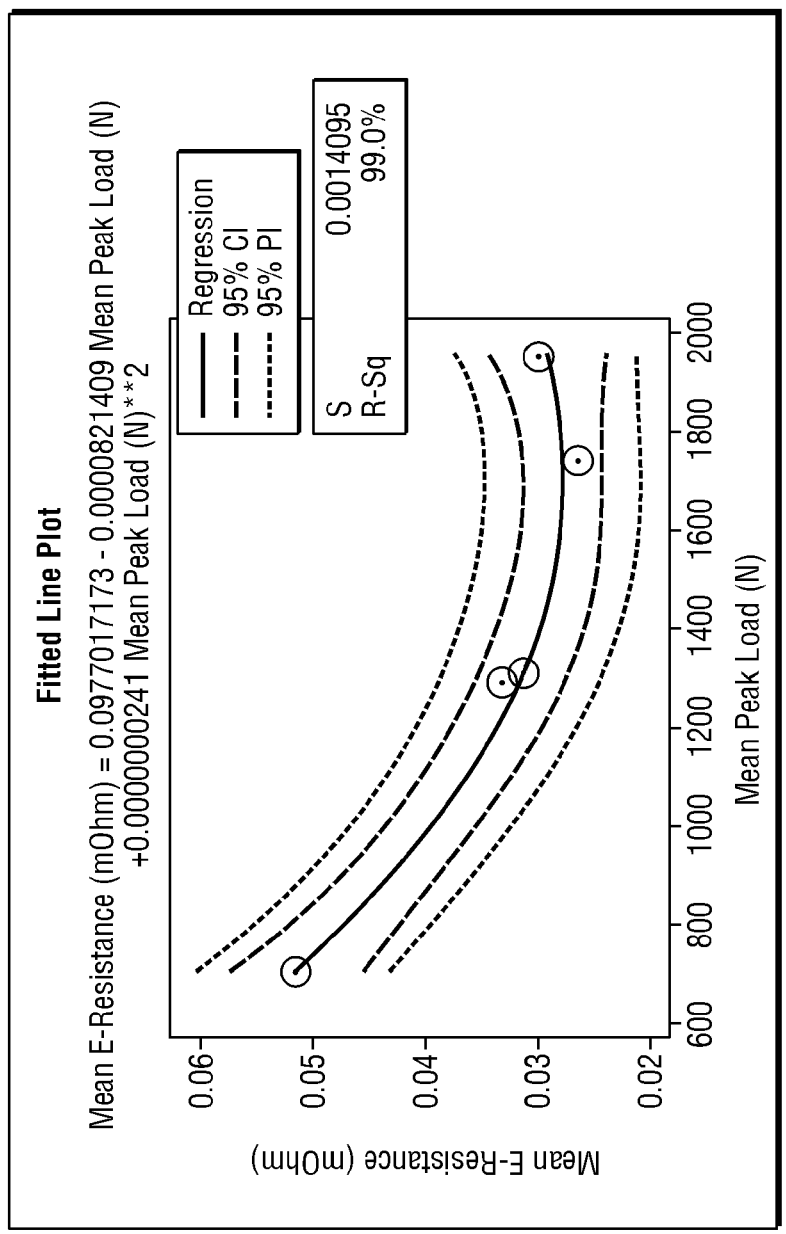
FIG. 7 illustratively depicts Pass/Fail criteria.
FIG. 8 illustratively depicts a fitted line plot of mean electric resistance and mean peak load.

FIG. 7 depicts exemplary electric Pass/Fail criteria for three ultrasonically welded joints between either of the materials of battery cell terminals in sheets/foils and the material of ICB busbars in sheet with various configurations and on either coupons or real battery modules as measured using Hioki 3560 AC mΩ Hi-Tester. The electric Pass/Fail criteria for electric joints may vary dependent upon the materials of electric joints, the number and size of electric joints, the joining method, the electric resistance measurement instrument and its calibration, the surface conditions of measurement clips and clamped areas, and the gauge repeatability & reproducibility. Accordingly, the electric Pass/Fail criteria may be adjusted based on these conditions.

The following factors may affect the electric pass-fail criteria: whether a material of higher electric resistivity is/are selected for electric joints, and/or the number and/or size of electric joints are/is reduced by design, and/or a joining method such as fastening is used, and/or an electric resistance measurement instrument calibrated to higher readings is used, and/or the surfaces of measurement clips and/or clamped areas are rougher or routinely contaminated, and/or the electric resistance measurement instrument and/or operator are/is constantly over-biased, the electric resistance thresholds in the electric Pass/Fail criteria need to be increased correspondingly.

Although the peak loads are different between coupon samples and real battery modules due to the different fracture mechanisms under different load conditions corresponding to their different layouts, the electric resistances across the electric joints on the coupon samples and real battery modules should be identical for the same materials of electric joints, same number and size of electric joints, same joining method, same electric resistance measurement instrument, and same surface conditions of measurement clips and clamped areas. Therefore, the electric Pass/Fail criteria described herein should be applicable to both coupon samples and real battery modules.

EXAMPLE

Example 1

The NDE method for coupon samples invented herein is used to measure electric resistances across the electric joints with three USW per joint on multiple lap-shear samples, each formed of 2-layers of aluminum foils modeling battery cell terminals and 1-layer of nickel-plated copper sheet simulating an interconnector busbar. The measured data are listed in Table 1.

TABLE 1

| Sample # | Electric Resistance (mΩ) | Mean (mΩ) | Standard Deviation (mΩ) |
|---|---|---|---|
| #1 | 0.038 | 0.035 | 0.0026 |
| #2 | 0.033 | | |
| #3 | 0.034 | | |

Example 2

The NDE method for coupon samples invented herein is used to measure electric resistances across the electric joints with three USW per joint between battery cell terminals and nickel-plated interconnector busbars on coupon samples. The measured data are summarized in Table 2.

TABLE 2

| | Battery Cell Terminals | | | | |
|---|---|---|---|---|---|
| | 3-Layers | | | | 2-Layers |
| Battery Cell Terminal Materials | Cu | Cu | Cu | Cu | Al |
| Percentage of Good Joints | 15% | 65% | 80% | 100% | 100% |
| Measured E-Resistance (mΩ) | 0.217 | 0.059 | 0.036 | 0.030 | 0.035 |
| E-Resistance Threshold (mΩ) | 0.22 | 0.06 | 0.04 | 0.03 | 0.04 |

As depicted in Table 2, the mean electric resistances corresponding to about 100% good joints are ≤0.04 mΩ; the mean electric resistance corresponding to about 80% good joint is about 0.04 mΩ; the mean electric resistance corresponding to about 65% good joint is about 0.06 mΩ and the mean electric resistance corresponding to about 15% good joint is about 0.22 mΩ. These data suggest that the resolution and sensitivity of the NDE methods invented herein are very high.

Using the method for deriving electric Pass/Fail criteria invented herein, electric joints may be regarded as "Pass" if the mean electric resistance across the electric joints is equal to or lower than 0.04 mΩ and any individual electric resistance among all joints is equal to or lower than 0.06 mΩ or "Fail" if the mean electric resistance across the electric joints is higher than 0.06 mΩ or any individual electric resistance among all joints is higher than 0.07 mΩ or "Marginal" for "Alert" if the mean electric resistance across the electric joints is higher than 0.04 mΩ but equal to or lower than 0.06 mΩ and no individual electric resistance among all joints is higher than 0.07 mΩ. These electric resistance thresholds are given in Table 2 and also shown in FIG. 5.

Example 3

FIG. 8 depicts the regression for the mean electric resistances across the electric joints with three USW per joint vs. the mean BOL peak loads of the same joints on lap-shear coupons between 3-layers of copper foils for battery cell terminals and 1-layer of nickel-electroplated copper sheet for interconnector busbars. Evidently, the higher electric resistances across the electric joints correlate to the lower BOL joint strengths. The BOL joint strengths in-turn correlate to joint durability or fatigue life. Hence, the NDE methods invented herein can detect weak joints (inadequate welds) and open joints with very high detectability.

As shown in FIG. 8, the regression equation derived includes a polynomial:

$$MER = a + bMPL + cMPL^2$$

where a, b and c are polynomial coefficients depending on many factors. Under the particular conditions of this example, a is about 0.098, b is $-8.2 \times 10^{-5}$, and c is $2.4 \times 10^{-8}$, and thus the regression equation is expressed as:

Mean E-Resistance (mOhm)=0.0977017173−
0.0000821409 Mean Peak Load
(N)+0.0000000241 Mean Peak Load (N)$^2$ which quantitatively relates the mean electric resistances across the electric joints with three USW per joint to the mean BOL peak loads of the same joints on the lap-shear coupons between 3-layers of copper foils for battery cell terminals and 1-layer of nickel-electroplated copper sheet for interconnector busbars.

The following application discloses and claims the methods and Pass/Fail criteria for verifying and validating electric joints that may be related to the methods disclosed and claimed in the U.S. patent application Ser. No. 13/353,838, which is incorporated herein by reference in its entirety.

While the best mode for carrying out the invention has been described in detail, those familiar with the art to which this invention relates will recognize various alternative designs and embodiments for practicing the invention as defined by the following claims.

What is claimed:

1. A method of evaluating an electric joint formed between a battery cell terminal and an interconnector busbar, comprising:
   at least partially separating a terminal portion of the battery cell terminal and a busbar portion of the interconnector busbar such that the terminal portion and the busbar portion are spaced apart from each other; and
   measuring electric resistance between the terminal portion and the busbar portion.

2. The method of claim 1, wherein the step of partially separating is carried out while the battery module is physically located within a vehicle.

3. The method of claim 1, wherein the joint includes one or more welds, and wherein the terminal portion and the busbar portion are spaced apart at a location of the joint different from where the one or more welds are located.

4. The method of claim 1, wherein the terminal portion is a corner portion of the battery cell terminal, the busbar portion is a corner portion of the interconnector busbar, or both.

5. The method of claim 1, wherein the step of measuring includes connecting the terminal portion of the joint to a first clip of a first polarity and connecting the busbar portion of the joint to a second clip of an opposing polarity.

6. The method of claim 5, further comprising flipping the first and second clips such that the terminal portion is connected to the second flip and the busbar portion is connected to the first flip, and repeating measuring of electric resistance.

7. The method of claim 6, further comprising obtaining an average value of the electric resistance before and after the flipping.

8. The method of claim 7, further comprising comparing the average value to a pre-determined value of electric resistance based on a corresponding peak load.

9. The method of claim 8, further comprising providing a correlation table tabulating values of electric resistance as a function of values of peak load.

10. The method of claim 9, wherein the providing step includes providing a correlation table tabulating mean electric resistance (MER) as a function of mean peak load (MPL) with the function represented as: $MER = a + bMPL + cMPL^2$, wherein a, b and c are each a constant.

11. The method of claim 8, further comprising providing a correlation table tabulating values of electric resistance as a function of values of joint strength.

12. The method of claim 1, wherein the partially separating step includes partially separating a joint in a lap sheer configuration.

13. The method of claim 1, wherein the partially separating step includes partially separating a joint in a coach peel configuration.

14. The method of claim 1, further comprising insulating one or more adjacent joints of the battery module.

15. The method of claim 14, wherein the insulating step includes insulating with insulating paper.

16. A method of evaluating a battery joint, comprising:
   partially separating a terminal portion from a busbar portion of a joint formed between a battery cell terminal and an interconnector busbar;
   connecting the terminal portion to a first clip of a first polarity and connecting the busbar portion to a second clip of an opposing polarity such that electric resistance between the terminal portion and the busbar portion is measured; and
   flipping the first and second clips such that the terminal portion is connected to the second flip and the busbar portion is connected to the first flip, and measuring of electric resistance between the terminal and busbar portions, such that an average value of the electric resistance before and after the flipping is obtained.

17. The method of claim 16, further comprising comparing the average value of electric resistance to a pre-determined value of electric resistance based on a corresponding peak load.

18. The method of claim 17, further comprising providing a correlation table tabulating values of electric resistance as a function of values of peak load.

19. The method of claim 18, wherein the providing step includes providing a correlation table tabulating mean electric resistance (MER) as a function of mean peak load (MPL) with the function represented as: $MER = a + bMPL + cMPL^2$, wherein a, b and c are each a constant.

20. A method of evaluating a battery joint located within a vehicle, comprising:
   partially separating a terminal portion from a busbar portion of a joint formed between a battery cell terminal and an interconnector busbar;

connecting the terminal portion to a first clip of a first polarity and connecting the busbar portion to a second clip of an opposing polarity such that electric resistance between the terminal portion and the busbar portion is measured; and flipping the first and second clips such that the terminal portion is connected to the second flip and the busbar portion is connected to the first flip, and measuring of electric resistance between the terminal and busbar portions, such that an average value of the electric resistance before and after the flipping is obtained;

providing a correlation table tabulating mean electric resistance (MER) as a function of mean peak load (MPL) with the function represented as: $MER = a - bMPL + cMPL^2$, wherein a, b and c are each a constant; and comparing the average value to a pre-determined value of electric resistance based on a corresponding peak load.

\* \* \* \* \*